United States Patent [19]
Kalb et al.

[11] Patent Number: 5,652,460
[45] Date of Patent: Jul. 29, 1997

[54] INTEGRATED RESISTOR NETWORKS HAVING REDUCED CROSS TALK

[75] Inventors: Jeffrey Clifford Kalb, Saratoga; Peruvamba Hariharan, Milpitas; John Dericourt Hurd, San Jose; Gregg Duncan, Morgan Hill, all of Calif.

[73] Assignee: California Micro Devices Corporation, Milpitas, Calif.

[21] Appl. No.: 539,935

[22] Filed: Oct. 6, 1995

[51] Int. Cl.$^6$ .................... H01L 29/00; H01L 21/70
[52] U.S. Cl. .................... 257/536; 257/542; 257/577; 257/750; 257/751; 257/761; 257/765; 257/924; 437/60; 437/189; 437/192; 437/194; 437/228; 437/918
[58] Field of Search ........................ 257/750, 751, 257/536, 542, 577, 761, 765, 924; 437/60, 189, 192, 194, 228, 918

[56] References Cited

U.S. PATENT DOCUMENTS

| | | | |
|---|---|---|---|
| 3,775,838 | 12/1973 | Dalmasso | 257/751 |
| 4,937,660 | 6/1990 | Dietrich et al. | 257/750 |
| 5,355,014 | 10/1994 | Rao et al. | 257/533 |
| 5,370,766 | 12/1994 | Desaigoudar et al. | 156/643 |
| 5,514,612 | 5/1996 | Rao et al. | 437/51 |

Primary Examiner—Edward Wojciechowicz
Attorney, Agent, or Firm—Hickman Beyer & Weaver

[57] ABSTRACT

An integrated circuit for implementing a resistor network on a die of the integrated circuit. The integrated circuit includes a common conductor, which is disposed on a first side of the die and coupled to resistors of the resistor network. The integrated circuit further includes a substantially conductive substrate through the die. There is further included a conductive back side contact coupled to the substantially conductive substrate. The conductive back side contact is disposed on a second side of the die opposite the first side, whereby the common conductor, the substantially conductive substrate, and the conductive back side contact form a common conducting bus from the common conductor to the conductive back side contact through the die.

28 Claims, 7 Drawing Sheets

INTEGRATED RESISTOR NETWORKS HAVING REDUCED CROSS TALK

BACKGROUND OF THE INVENTION

The present invention relates generally to the manufacture of integrated resistor networks. More particularly, the present invention relates to an integrated resistor network that advantageously minimizes the cross talk between and among its various components.

Cross talk represents the unwanted interference experienced by a signal due to the presence of another signal in another part of the circuit. In the past, integrated resistor networks, i.e., those implemented on a semiconductor wafer die, have suffered from a high level of cross talk between adjacent resistors due to their high level of parasitic capacitance and inductance. These parasitic capacitances and inductances exist in the common and adjacent conductors that couple together the resistors, as well as in those that couple individual resistors to their respective pins. Due to the cross talk, the signal on one conductor is affected when another signal is present on another conductor on the semiconductor wafer die. When there is cross talk, the affected signal may be altered, giving rise to errors. In general, the higher the frequency at which the resistor network is operated, the more susceptible to cross talk it becomes.

FIG. 1A illustrates a representative prior art integrated resistor network to facilitate discussion of the cross talk problem. An equivalent circuit for the prior art resistor network of FIG. 1A is shown in a subsequent drawing FIG. 1B. Referring now to FIG. 1A, there is shown a wafer die 100, on which an integrated resistor network comprising resistors R1–R22 are implemented. Each of resistors R1–R22 is coupled to a common surface bus 102 via surface feeder conductors 104. As shown, there is at least one surface feeder conductor 104 from each resistor to common surface bus 102. Each of resistors R1–R22 is further coupled to one of respective pads P1–P22 via another surface conductor.

In operation, the coupling of adjacent resistors via their respective feeder conductors 104 and common surface bus 102 gives rise to inductance. This inductance in turn increases the susceptibility of signals on adjacent pins (and concomitantly on adjacent resistors) to cross talk. Such inductance between adjacent pins through common surface bus 102 is represented, for example, by inductors 202 in the circuit equivalence drawing of FIG. 1B.

Further, since the common node of the resistors, i.e., common surface bus 102, resides strictly at the top surface of the die in the prior art, it is necessary to couple common contact conductors from the common contact pads, e.g., pads 106 and 108, of the die to common surface bus 102 to provide an electrical path thereto. In FIG. 1A, these common contact conductors are designated by reference numerals 105 and 107. The presence of common contact conductors 105 and 107 gives rise to additional inductance, which is representatively identified in FIG. 1B by inductors 204. As can be appreciated, the presence of parasitic inductors 202 and 204 through the common resistor node contributes to the high level of cross talk between adjacent resistors of the prior art integrated resistor network.

Additionally, the prior art resistor network of FIG. 1A implements their resistors on top of a floating substrate of semiconductor wafer die 100. This floating substrate, which underlies the resistors, gives rise to capacitive coupling among the resistors. The resulting capacitors that are formed between the floating substrate and the resistive regions of the resistors as well as between the floating substrate and the resistors' pads are shown representatively by capacitors 206 and 208 respectively in FIG. 1B. Because of this capacitive coupling, whenever there is a potential level on a given resistor, this voltage potential will affect, via the floating substrate, signals at other parts of the wafer die. The result is an elevated level of cross talk among the resistors of the prior art integrated resistor network.

In view of the above, what is desired is improved methods and apparatus for forming integrated resistor networks. The improved integrated resistor network preferably offers improved electrical characteristics, particularly at high frequencies, by reducing the parasitic inductance and capacitance between and among the resistors of the integrated resistor network.

SUMMARY OF THE INVENTION

The present invention relates to an integrated resistor network having a low level of cross talk among its resistors. In one embodiment, the invention relates to a resistor network having a first resistor and a second resistor. The first resistor and the second resistor have respectively a first resistive region and a second resistive region formed on a first side of a wafer die of an integrated circuit chip. The resistor network includes a common conductor, which is disposed on the first side of the die and coupled to both the first resistive region and the second resistive region.

The resistor network further includes a substantially conductive substrate through the die and a conductive back side contact coupled to the substantially conductive substrate. The conductive back side contact is disposed on a second side of the die opposite the first side. In this embodiment, the common conductor, the substantially conductive substrate, and the conductive back side contact form a common conducting bus from the common conductor to the conductive back side contact through the die.

In another embodiment, the invention relates to a method for fabricating an integrated circuit, which has a resistor network implemented on a substantially conductive substrate of the integrated circuit. On a first side of this substrate, a layer of silicon dioxide is formed. A trench is etched through the layer of silicon dioxide to the substrate using a conventional photolithographic method. In this trench, a low ohmic contact with the substrate is formed. Note that with the exception of this low ohmic contact and the common conducting bus of which it is a part, all other components of the integrated resistor network is isolated from the substrate by this layer of silicon dioxide.

The method includes the step of forming a resistive layer above the contact layer, the resistive layer having a first resistive region and a second resistive region. Additionally, the method includes the step of forming a conductive layer above the resistive layer. It should be borne in mind that as the terms are used herein, "above" and "under" and other like terms indicate the relative spatial position between two or more entities and does not necessary require a direct contact between those entities. The conductive layer has a common conductor, a first resistor pad, and a second resistor pad. The common conductor is electrically coupled with both the first resistive region and the second resistive region. The first resistor pad is electrically coupled with the first resistive region while the second resistor pad is electrically coupled with the second resistive region. The common conductor, the first resistive region, and the first resistor pad form a first resistor of the resistor network. Similarly, the common conductor, the second resistive region, and the second resistor pad form a second resistor of the resistor network.

The method further includes the step of forming a conductive back side on a second side of the die opposite the first side. The conductive backside is coupled to the substrate, wherein the common conductor, the substrate, and the conductive back side form a common conducting bus from the common conductor to the conductive back side through the die.

BRIEF DESCRIPTION OF THE DRAWINGS

Additional advantages of the invention will become apparent upon reading the following detailed description and drawings.

DETAILED DESCRIPTION OF THE INVENTION

Figure 1A:
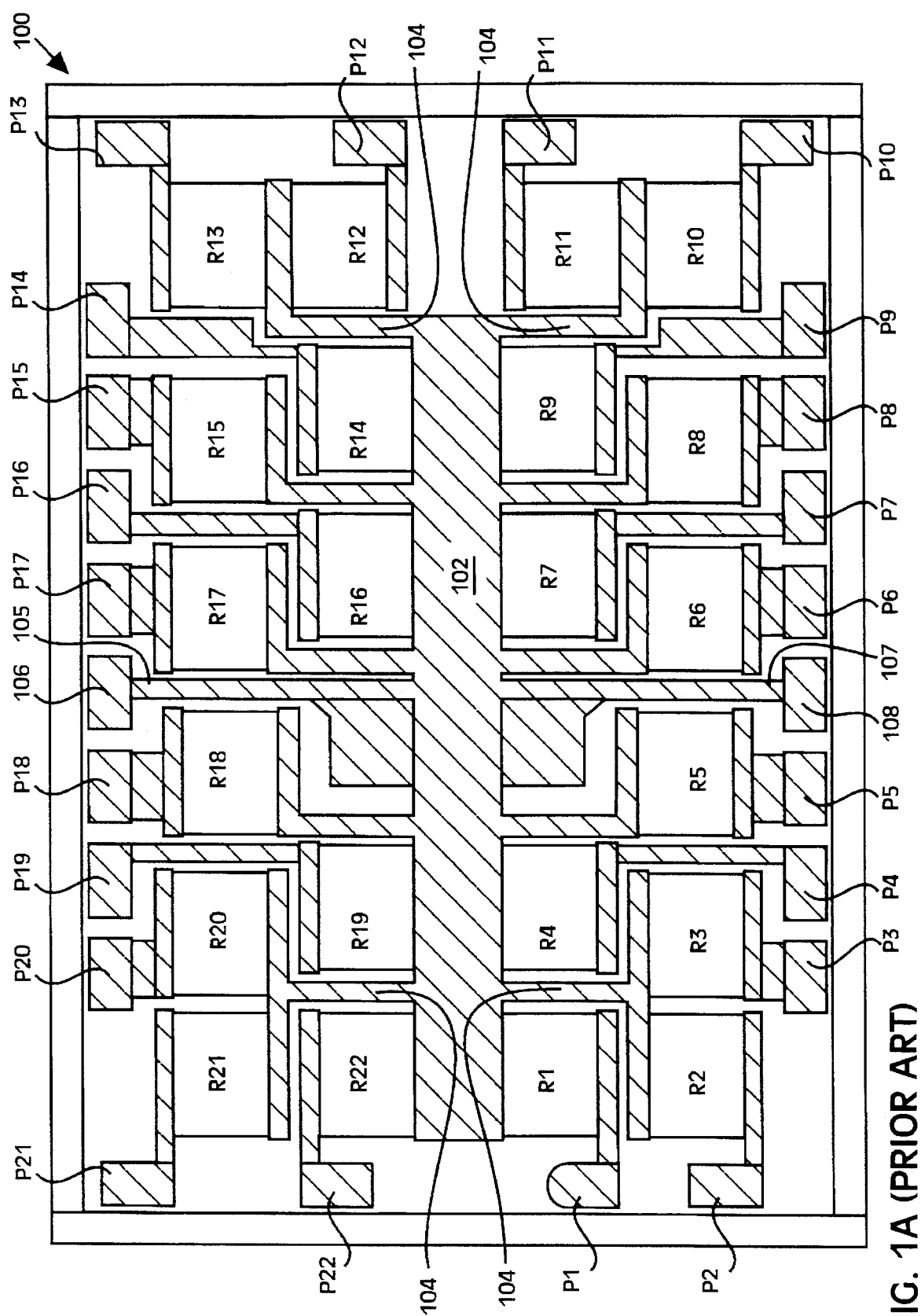
FIG. 1A shows a representative prior art integrated resistor network.
Figure 1B:
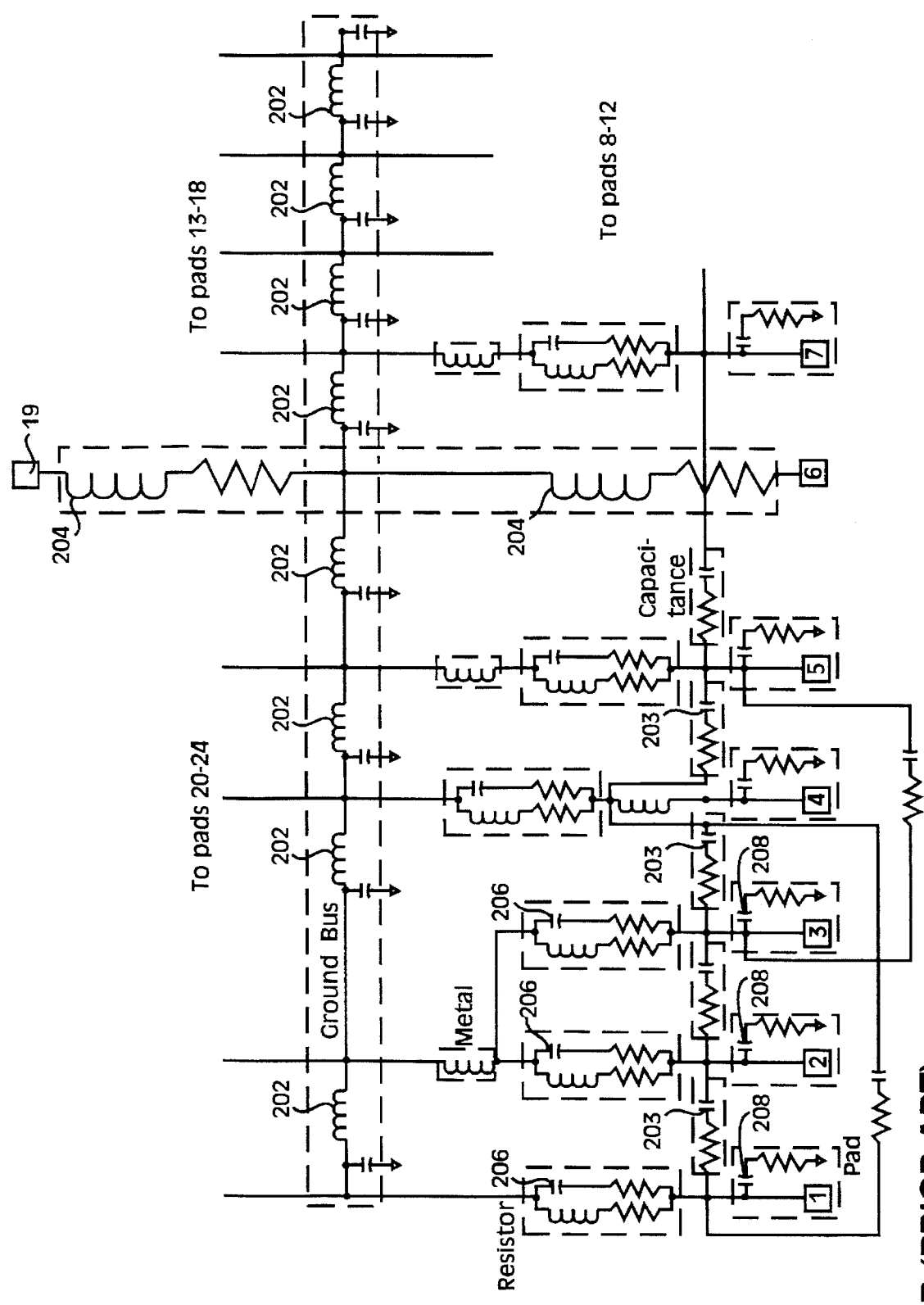
FIG. 1B shows a circuit equivalence diagram for the integrated resistor network of FIG. 1A, including the modeled parasitic inductance and capacitance, to facilitate discussion of the cross talk problem.

FIGS. 1A and 1B show a representative prior art integrated resistor network and its circuit equivalence diagram, respectively, for illustrating the cross talk problem.

Figure 2:
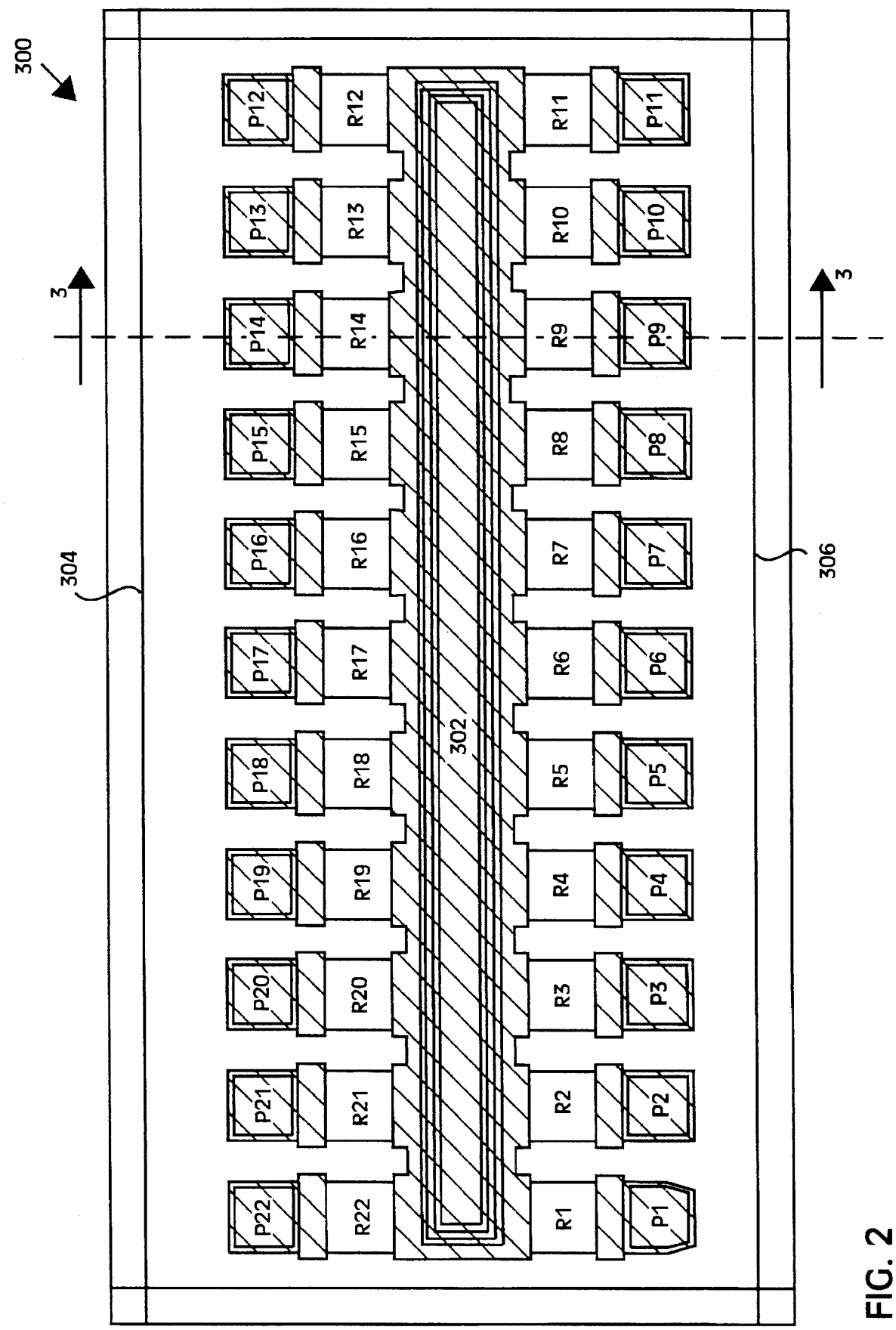
FIG. 2 shows, in one preferred embodiment, an improved integrated resistor network structure.

FIG. 2 shows, in one preferred embodiment, an improved integrated resistor network structure that advantageously minimizes the parasitic inductance and capacitance between and among its resistors to improve high frequency characteristics. In FIG. 2, there is shown a semiconductor die 300 (cut from a semiconductor wafer) having thereon a resistor network comprising 22 resistors R1–R22. Common conductor 302, representing the common node of resistors R1–R22, is aligned parallel to and disposed in between edges 304 and 306 of die 300. Each of resistors R1–R22 is disposed perpendicular to common conductor 302. As shown, two rows of resistors are formed, one on each side of common conductor 302.

The arrangement of resistors R1–R22 in rows, each of which is perpendicular to common conductor 302, offers particular advantages. Since each resistor essentially abuts common conductor 302, the length of the metal line required to couple each resistor to the common conductor is substantially minimized. This is in sharp contrast to the prior art integrated resistor network of FIGS. 1A–1B in which numerous surface feeder conductors 104 are required to couple the resistors of the resistor network to common surface bus 102.

Further, the arrangement of FIG. 2 disposes one end of each resistor at a die edge, e.g., edge 304 or 306. Therefore, the length of the metal line required to couple a resistor to its contact pad, e.g., from resistor R1 to pad P1, is also substantially minimized. Since the inductance of a conductor is proportional to its length, the reduction in the length of these metal lines advantageously reduces inductance, thereby reducing cross talk and improving performance at higher frequencies.

Common conductor 302 of FIG. 2 is part of a common conducting bus through die 300. As will be explained in greater detail in a subsequent FIG. 3A, the common conducting bus permits current to flow through the die to the back side of the die. Since the current path for the common conductor is through the die instead of along its top surface, as was done in the prior art, the present invention advantageously eliminates the need for surface conductors, e.g., conductors 105 and 107 of FIG. 1A (these conductors are necessary in the prior art to provide access to the resistors' common node). The elimination of these conductors from the top surface of the wafer die advantageously reduces the die size of the resulting integrated resistor network.

Further, the elimination of these surface common contact conductors, e.g., conductors 105 and 107 of FIG. 1A, which tend to be long, thin, and therefore highly inductive, advantageously reduces the inductance of the common conductor. With reference to the circuit equivalence drawing of FIG. 1B, inductors 204 are substantially eliminated. The reduction of the inductance at this common node advantageously reduces cross-talk, thereby improving performance at higher frequencies.

Moreover, the elimination of these surface conductors 105 and 107, together with the above-discussed reduction in the length of the conductors that couple the resistors to their respective contact pads and to common conductor 302, also reduces the parasitic cross-capacitance that arises between and among surface conductors. The reduced cross-capacitance among resistors in turn minimizes the potential for undesirable cross talk when different signals are present on different pins of the integrated resistor network.

As an additional advantage, the use of substantially conductive substrate 320 and conductive back side contact 322 to conduct current away from common conductor 302 advantageously increases the effective width of the common conducting bus. As is well known, inductance is inversely proportional to a conductor's width for a given length. When the effective width of the common conducting bus is increased, its inductance decreases. Consequently, cross talk among the resistors of the resistor network through the common conductor is further minimized.

In the prior art integrated resistor network, the resistors of the resistor network are implemented above a floating wafer substrate, i.e., a wafer substrate that is not coupled to a particular potential level. Because the substrate is left floating in the prior art, the presence of a voltage potential at one part of the die affects the potential at other parts, contributing to the cross talk among the resistors of the integrated resistor network. In contrast, the substrate of the integrated resistor network of the present invention, being part of the common conducting bus, is always at the common potential (which may be ground in certain cases). Consequently, the capacitive effects among the resistors are substantially reduced, concomitantly minimizing cross talk.

The combination of the inventive resistor network architecture and the use of the common conducting bus through the die advantageously results, in one embodiment, in an integrated resistor network that has a cross talk level among adjacent pads of below –20 dB at 10 GHz. In one case, cross talk of about –47 dB at 1 GHz and about –26.5 dB at 10 GHz is achieved using the inventive technique disclosed herein. This is a dramatic improvement over the prior art integrated resistor network of FIG. 1A, which has a cross talk level of about −21 dB at 1 GHz and about −9.2 dB at 10 GHz.

Figure 3A:
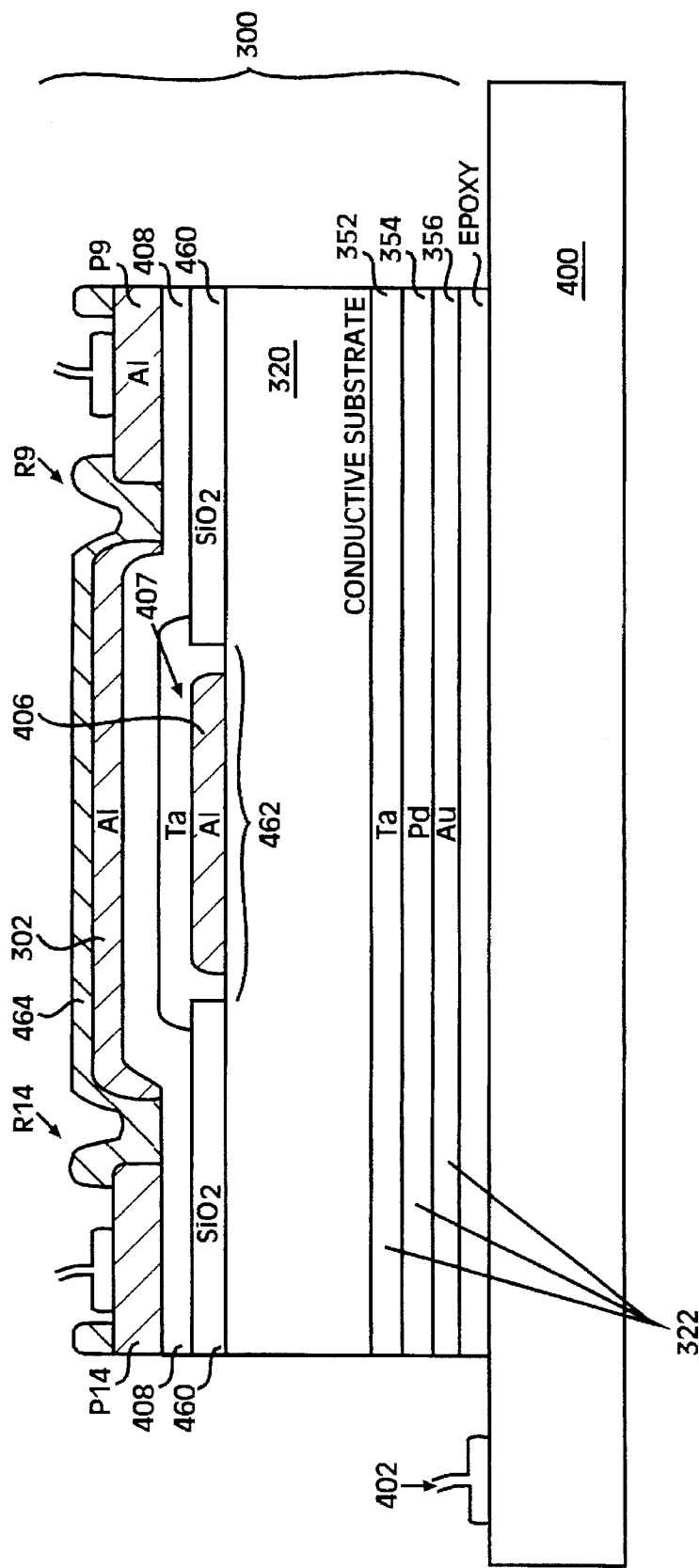
FIG. 3A is a cross-section view taken along line 3—3 of FIG. 2.

To discuss one embodiment of the inventive integrated resistor network in greater detail, FIG. 3A illustrates a cross-section view through line 3—3 of die 300 of FIG. 2. Conductive lead frame 400 and back side contact connector 402 represent the electrical connection between conductive back side 322 and common potential pins on the integrated circuit (IC) chip. In one embodiment, two common potential pins are provided per integrated resistor network IC although one may suffice in some applications.

In the preferred embodiment, conductive lead frame 400 is coupled to conductive back side 322 using a conductive epoxy material. Other methods for attachment may well be employed, including, for example, silicon/gold eutectic or soldering. In one embodiment, conductive back side 322 includes three conductive layers: a tantalum layer 352, a palladium layer 354, and a gold layer 356. It will be apparent to those skilled in the art that the use of all three layers or these particular conductor materials is not necessary for all applications for good conductivity.

Conductive back side 322 is electrically coupled to substantially conductive substrate 320. Substantially conductive substrate 320 is preferably a silicon substrate that is heavily doped with arsenic. In one embodiment, substantially conductive substrate 320 preferably has a resistivity of about 0.005 Ω-cm or lower. Arsenic is a particularly preferred dopant since its use, in conjunction with aluminum ohmic contacts, results in a surprisingly low resistance conducting bus through the die. Note that although arsenic is used as a substrate dopant, other suitable dopants may also be used to obtain a low resistivity substrate.

Above substrate 320, a layer of silicon dioxide 460 having a thickness of about 10,000 angstroms is formed. A trench 462 is etched in this layer of silicon dioxide using a conventional photolithographic technique. An aluminum layer 406 electrically couples substantially conductive substrate 320 in trench 462 to provide a low ohmic contact to the substrate. Above this aluminum layer 406, there is disposed an optional diffusion barrier layer 407. In one embodiment, a diffusion barrier layer 407 preferably comprises conductive tantalum. The function of a diffusion barrier layer 407 is to prevent silicon atoms of substrate 320 from diffusing into a subsequently formed resistive layer 408. However, if the substrate is not subject to a subsequent process, e.g., heat treatment, that might cause the silicon atoms to diffuse into the resistive layer, diffusion barrier layer 407 may be omitted.

In the specific example of FIG. 3A, resistive layer 408 is preferably a film of tantalum nitride ($Ta_3N_4$). Resistive layer 408 is typically very thin, around 300–1000 angstrom thick, and having a resistance in the micro-ohm range through its thin cross section. Above resistive layer 408, there is disposed an aluminum layer 302. This aluminum layer 302 represents the common conducting node to all resistors of the resistor network.

Pads P9 and P14 represent the pads for resistors R9 and R14 respectively. For ease of illustration, only resistor R9 is discussed in detail herein. When there is a potential on pad P9, current flows through resistive layer 408 to the common conducting bus 302. The region in resistive layer 408 that a current must flow between a resistor pad and the common conducting bus defines the resistive region of that resistor. The length of the electrical path through the resistor's resistive region partially determines the resistance value of that resistor (the other two variables being the width of this resistive layer and the nature of the resistive material). Once current reaches the common conducting bus, it flows to back side contact connector 402 via optional diffusion barrier layer 407, aluminum layer 406, substantially conductive substrate 320, conductive back side contact 322, and conductive lead frame 400.

The use of an aluminum low ohmic contact, e.g., aluminum layer 406, in conjunction with a heavily doped arsenic substrate advantageously offers a surprisingly low resistance path through the die to the conductive back side. In one embodiment, a resistance of about 0.5Ω is achieved for the common conducting bus through the die. In contrast, a resistance value around 6 Ω is obtained if antimony substrate dopant and palladium contact metal had been used instead.

The ability to reduce the resistance in the current path between each resistor terminal and the conductive back side is desirable since this reduces the voltage divider effect between the resistor's resistive region and the resistance of the current path to the common potential. Without a low resistance current path through the substrate, the use of a back side contact to conduct current away from the resistors' common node would have been impractical. This is because a high resistance common conductor bus would create a voltage divider circuit, with the voltage across this resistance common to all components, thus resulting in cross talk.

In order to employ a back side contact to conduct current away from common conductor 302, a conducting bus through the wafer should preferably have as low a resistance value as possible. A conducting bus having a resistance value below 1 Ω, more preferably below 0.5 Ω, and most preferably below 0.25 Ω, should be employed.

Figure 3B:
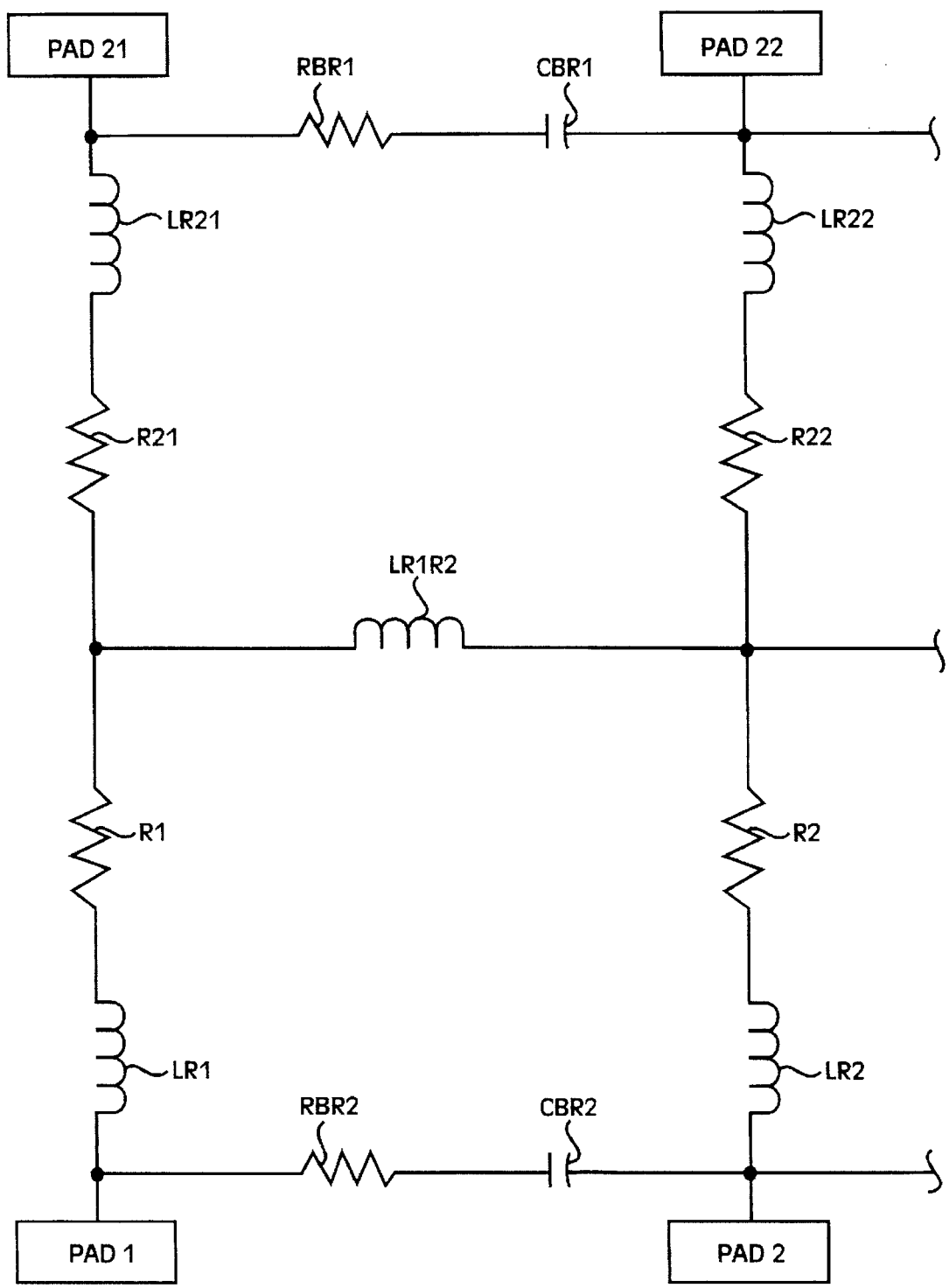
FIG. 3B is an approximate model for the parasitic inductance and resistance of a portion of FIG. 3A.

FIG. 3B is an approximate model for the parasitic inductance and resistance of a portion of FIG. 3A. In FIG. 3B, inductor Lr21 represents the inductance in the metal line between the pad of resistor R21 and its resistive region. Due to the layout of the integrated resistor network of the present invention and the corresponding reduction in the metal lines, the value of inductor Lr21 is reduced to, in one embodiment, about 20% of the value of corresponding parasitic inductor 214 of the prior art integrated resistor network (which model is shown in FIG. 1B).

Also due to the layout of the present invention, the resistors of the inventive integrated resistor network essentially abut the common bus. Consequently, the metal lines that are required in the prior art to couple the resistors to the common node, e.g., conductors 104 of FIG. 1A, are substantially eliminated. This in turn results in the substantial elimination of parasitic inductors 212 of FIG. 1B.

Since the metal lines that couple to the resistors act as capacitor plates, the reduction of the metal lines also reduces the cross capacitance between the resistors. In one embodiment, for example, capacitor CBr1, representing the cross capacitance between resistors 1 and resistor 2, has a value of about 10% of the value of corresponding parasitic capacitor 203 of the prior art integrated resistor network (model shown in FIG. 1B).

Because the bus of the integrated resistor network of the present invention is coupled directly to the common potential through the substrate of the wafer die, the parasitic inductance between the resistors through the bus is also reduced. For example, inductor Lr1r2 of FIG. 3B has a value that is, in one embodiment, about 5–10% of the value of corresponding parasitic inductor 202 of the prior art integrated resistor network of FIG. 1B. Advantageously, the parasitic capacitors 216 of FIG. 1B, which is formed between the prior art bus and the floating substrate, is also substantially reduced when the substrate is coupled to the common potential.

Note that parasitic inductors 204 of FIG. 1B are substantially eliminated in FIG. 3B. The elimination of this parasitic inductance is possible because the common current path now flows from the common surface conductor, representing the common node for the resistors, through the substrate out to the back side contact. Consequently, surface conductors are no longer necessary to provide access to this common node, thereby eliminating the parasitic inductors that are associated therewith. As can be appreciated from the foregoing, the elimination or substantial reduction of these parasitic inductors and capacitors in the integrated resistor network of the present invention improves its cross talk characteristics, particularly at high frequencies.

Figure 4:
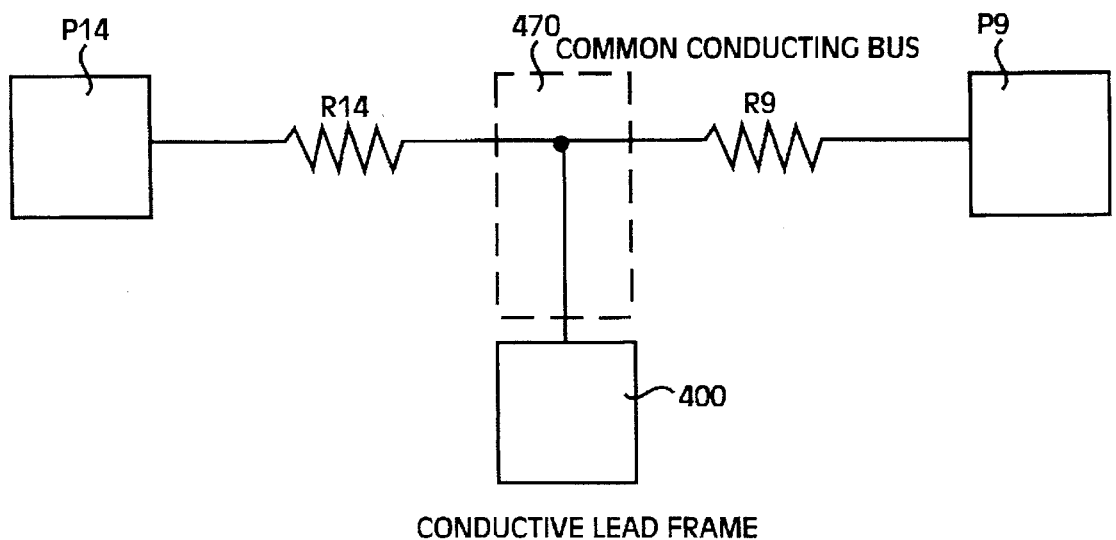
FIG. 4 shows the equivalent circuit diagram for certain portions of the structure shown in FIG. 3A.

FIG. 4 shows the equivalent circuit for certain portions of the structure shown in FIG. 3A. Pads P9 and P14 are shown coupled to resistors R9 and R14 respectively. Each of resistors R9 and R14 has one end coupled to the common conducting bus 470, which forms a conductive current path from the common node of the resistors to the IC conductive lead frame 400. Because the common current path now flows through the wafer substrate instead of along surface conductors, as was done in the prior art, inductance and cross talk is substantially minimized.

Figure 5:
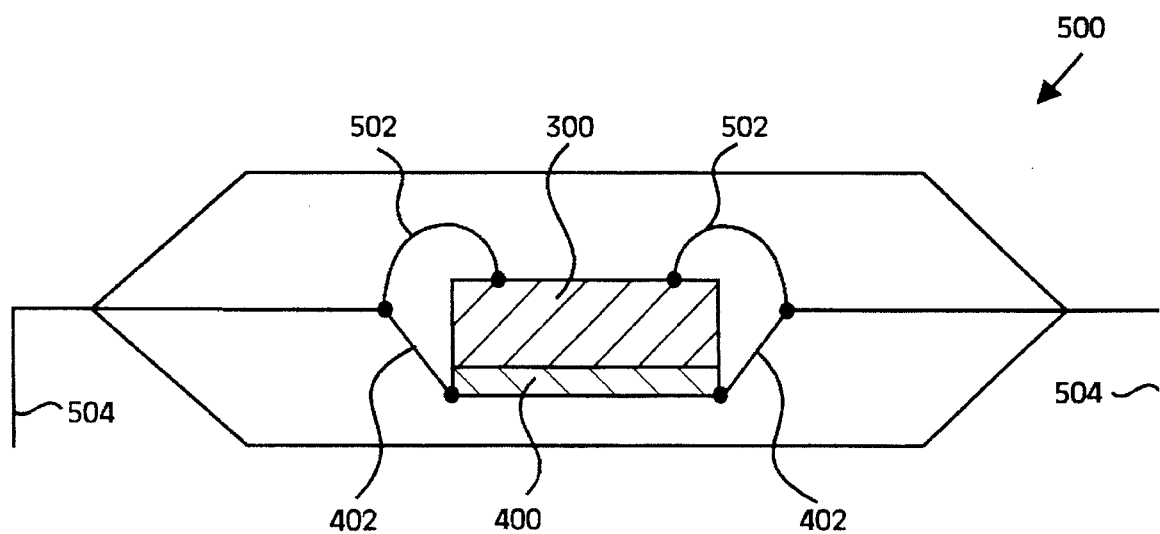
FIG. 5 shows, in accordance with one aspect of the invention, a cutaway view of an IC chip that implements the inventive integrated resistor network.

FIG. 5 shows, in accordance with one aspect of the invention, a cutaway view of an IC chip that implements the inventive integrated resistor network. In FIG. 5, die 300 is shown encapsulated in plastic to form an IC 500. Die 300 represents the die on which the inventive resistor network is formed. A plurality of wires 502 couple the pads of the resistor network to the fingers of the lead frame 400 of IC 500. Die 300 is disposed on conductive lead frame 400, which is coupled to the common potential pins of IC 500 via back side contact connectors 402. Although two back side contact connectors 402 are shown in the example of FIG. 5, a greater or fewer number may be employed as appropriate.

Figure 6:
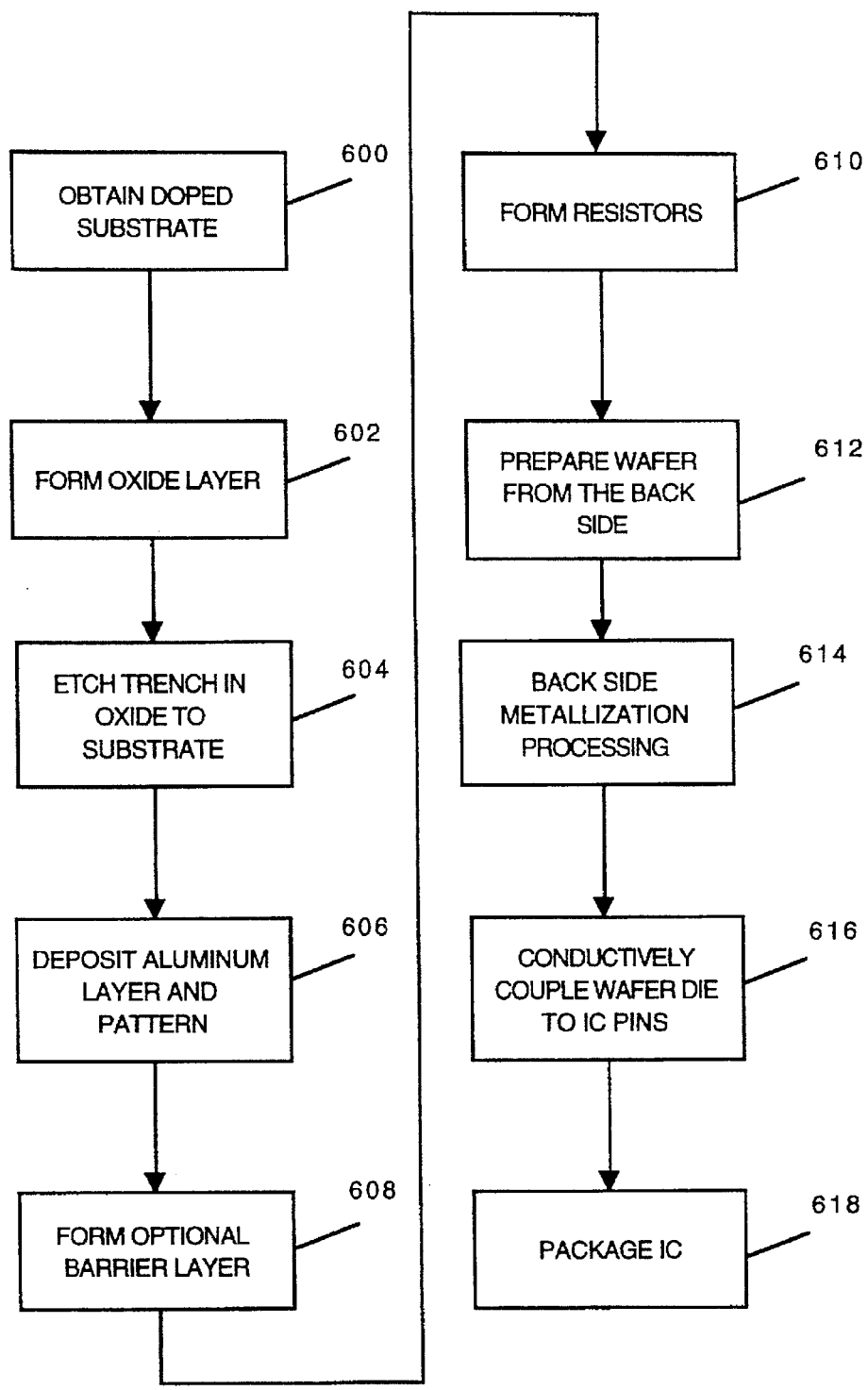
FIG. 6 shows, in accordance with another aspect of the present invention, the steps involved in fabricating the integrated circuit chip of FIG. 5.

FIG. 6 shows, in accordance with another aspect of the present invention, the steps involved in fabricating IC 500 of FIG. 5. In block 600, a low resistance, highly doped substrate is first obtained. The doped substrate of block 600 is preferably an arsenic-doped silicon wafer having a resistivity of below 0.01 Ω-cm, and preferably below 0.005 Ω-cm. Other dopants such as boron or antimony may be substituted. The conductivity of the substrate may vary depending on the specification of the resulting integrated resistor network. In general, however, the substrate must be conductive.

In block 602, a layer of silicon dioxide is grown on top of the substrate, preferably using a thermal oxidation method. This oxide layer corresponds to layer 460 of FIG. 3A and is preferably, but not necessarily, about 10,000 angstrom thick or more.

In block 604, a trench through the oxide layer is etched down to the underlying substrate, using a conventional photolithographic method. This trench, which corresponds to trench 462 of FIG. 3A, permits a subsequently deposited layer of aluminum to make low ohmic electrical contact with the conductive substrate layer to form part of the common conducting bus through the wafer die.

In block 606, a layer of aluminum is formed, preferably by sputtering over the oxide layer formed in block 602 and the trench etched in block 604. In one embodiment, the aluminum layer is about 10,000 angstrom thick although a thicker or thinner layer may suffice as a low ohmic contact. Also in block 606, the aluminum layer is patterned, using a conventional photolithographic technique, to define low ohmic contact 406 of the common conducting bus. Although low ohmic contact 406 is shown to be disposed within trench 462, it is equally well, in an alternative embodiment, that this low ohmic contact overlaps parts of oxide regions 460.

In block 608, an optional anti-diffusion barrier layer, preferably of conductive tantalum, is formed over the aluminum ohmic contact formed in block 606. This anti-diffusion layer advantageously prevents silicon from the substrate from contaminating a subsequently formed resistive layer. However, if there is little risk of diffusion of silicon in the processing steps subsequent to block 606, it is contemplated that step 608 may be omitted altogether. If an anti-diffusion layer is required, materials other than tantalum may also be used. The exact material of the barrier layer depends on the nature of the resistive material and the subsequent processes, e.g., heat treatment and the like, to which the wafer die will be exposed.

If the anti-diffusion barrier layer is formed in block 608, it is further patterned, using a conventional photolithographic technique, to provide a barrier that satisfactorily covers the trench formed in block 604 without shorting out other regions of the resulting wafer die.

In block 610, the resistor components are formed. Included in block 610 is the step of forming a resistive film, preferably of tantalum nitride ($Ta_3N_4$). In one embodiment, this resistive layer of tantalum nitride, which corresponds to layer 408 of FIG. 2, is preferably sputtered on to a specified thickness to obtain the desired resistance value.

Also in block 610, a second aluminum layer is sputtered on, say to about 10,000 angstrom thick, and is patterned to form the pads of the resistors as well as the second aluminum layer of the conducting bus. With reference to FIG. 2, these regions correspond to pads P9/P14 and aluminum layer 302 respectively. It should be appreciated that the resistance of a resistor may be altered by modulating the effective length of the electrical path through the resistive layer, e.g., by varying the relative distance between the pad of a resistor and the common conducting bus. A thicker resistive layer would provide a wider current path between pad P9 and the common conductor bus, thereby lowering the effective resistance of the resistor. A different resistive material, e.g., Si-chrome, nichrome, hafnium diboride, tantalum-aluminum, silicon oxide (SiO as opposed to silicon dioxide $SiO_2$), or the like, may also be employed to obtain the desired resistance value. By varying these three variables, the desired resistance value may be derived.

Also in block 610, the wafer is heat treated to optimize the electrical contact between the various layers of the common conducting bus through the wafer die. In the preferred embodiment, the die is heat treated at about 450 degrees Celsius for around 20 minutes. Depending on the resistance tolerance, the resistive and contact materials used, and the effective area of the ohmic contact, this step may be varied as appropriate. Also in block 610, a standard passivation step may be performed if required. This passivation layer corresponds to layer 464 of FIG. 3A.

In block 612, the bottom surface of the wafer is next prepared. In one embodiment, the wafer may be thinned, e.g., by grinding, to shorten the electrical path via the common conductor bus. The final wafer thickness is one that is suitably thin but does not render the wafer fragile and susceptible to breakage in subsequent processing steps. A wafer thickness of around 10–14 mils for a 5-inch wafer has been found to be suitable. To achieve a smooth surface, backlapping may also be performed on the bottom surface of the wafer.

In block 614, the back side metal layer is formed. In one embodiment, successive layers of tantalum and palladium are sputtered onto the bottom surface of the wafer. Gold may also be plated thereon to provide a low resistance contact layer. A conductive epoxy to bond the back side metal layer to the conductive lead frame may also be applied. It should be borne in mind that the steps of block 614 are discussed for illustration purposes only and that other known methods of back side metal processing may also be employed.

In block 616, the die that results is conductively coupled to pins on the IC package. These pins provide a current path to each resistor of the resistor network as well as to the common conducting bus. Preferably, the length of conductors from the die pads to the IC pins is kept as short as practicable to minimize any parasitic inductance and resistance.

In block 618, the resulting IC is packaged, using conventional IC packaging techniques, to create IC 500 of FIG. 5. It should be borne in mind that the final die may be used in either its packaged or unpackaged form by manufacturers in a variety of electronic devices. Because of its low level of cross talk at high operating frequencies, the IC manufactured in accordance with the present inventive technique is particularly suitable for use in modern electronic and computing equipments, particularly those operating at high frequencies.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A resistor network having a first resistor and a second resistor, said first resistor and said second resistor having respectively a first resistive region and a second resistive region formed on a first side of a wafer die of an integrated circuit chip, comprising:

a common conductor, said common conductor being disposed on said first side of said die and coupled to both said first resistive region and said second resistive region;

a substantially conductive semiconductor region having one conductivity type through said die from a top surface of said die to a bottom surface of said die, said one conductive type being one of a p-type and an n-type; and a conductive back side contact coupled to said substantially conductive semiconductor region, said conductive back side contact being disposed on a second side of said die opposite said first side, wherein said common conductor, said substantially conductive semiconductor region, and said conductive back side contact form a common conducting bus for said resistor network from said common conductor to said conductive back side contact through said die.

2. The resistor network of claim 1 wherein said common conductor is aligned parallel to and in between a first edge and a second edge of said die, said first resistor being disposed perpendicular to said common conductor between said first edge and said common conductor, said second resistor being disposed perpendicular to said common conductor between said second edge and said common conductor.

3. The resistor network of claim 1 wherein said substantially conductive semiconductor region represents a highly doped arsenic region.

4. The resistor network of claim 3 wherein said conductive back side contact is coupled to a lead frame of said integrated circuit chip.

5. The resistor network of claim 3 wherein said common conducting bus further comprises a resistive layer under said common conductor.

6. The resistor network of claim 5 wherein said common conducting bus further comprises an anti-diffusion layer under said resistive layer.

7. The resistor network of claim 6 wherein said common conducting bus further comprises an aluminum layer under said anti-diffusion layer, said aluminum layer forming a low ohmic contact with said substantially conductive semiconductor region.

8. The resistor network of claim 6 wherein said resistive layer comprises tantalum nitride.

9. The resistor network of claim 8 wherein said anti-diffusion layer comprises tantalum.

10. The resistor network of claim 5 wherein said common conducting bus further comprises an aluminum layer under said resistive layer, said aluminum layer forming a low ohmic contact with said substantially conductive semiconductor region.

11. A method for fabricating an integrated circuit, said integrated circuit having a resistor network implemented on a substantially conductive semiconductor region in a die of said integrated circuit, comprising:

forming a low ohmic contact layer on a first side of said substantially conductive semiconductor region, said substantially conductive semiconductor region having one conductivity type through said die from a top surface of said die to a bottom surface of said die, said one conductivity type being one of a p-type and an n-type;

forming a resistive layer above said contact layer, said resistive layer having a first resistive region and a second resistive region;

forming a conductive layer above said resistive layer, said conductive layer having a common conductor, a first resistor pad, and a second resistor pad, said common conductor being electrically coupled with both said first resistive region and said second resistive region, said first resistor pad being electrically coupled with said first resistive region, said second resistor pad being electrically coupled with said second resistive region, whereby said common conductor, said first resistive region, and said first resistor pad form a first resistor of said resistor network, said common conductor, said second resistive region, and said second resistor pad form a second resistor of said resistor network; and forming a conductive back side on a second side of said die opposite said first side, said conductive backside being coupled to said substantially conductive semiconductor region, wherein said common conductor, said substantially conductive semiconductor region, and said conductive back side form a common conducting bus for said resistor network from said common conductor to said conductive back side through said die.

12. The method of claim 11 wherein said common conductor is aligned parallel to and in between a first edge and a second edge of said die, said first resistor being disposed perpendicular to said common conductor between said first edge and said common conductor, said second resistor being disposed perpendicular to said common conductor between said second edge and said common conductor.

13. The method of claim 11 wherein said contact layer comprises aluminum and said substantially conductive semiconductor region is doped with arsenic dopant.

14. The method of claim 13 further comprising the step of heat treating said die to improve the conductivity of said common conducting bus.

15. The method of claim 13 further comprising the step of coupling said conductive back side to a lead frame of an integrated circuit chip.

16. The method of claim 11 further comprising the step of forming an anti-diffusion layer between said resistive layer and said contact layer.

17. The method of claim 16 wherein said anti-diffusion layer comprises tantalum.

18. An integrated circuit for implementing a resistor network on a die of said integrated circuit, comprising:
   a common conductor, said common conductor being disposed on a first side of said die and coupled to resistors of said resistor network;
   a substantially conductive semiconductor region having one conductivity type through said die from a top surface of said die to a bottom surface of said die, said one conductivity type being one of a p-type and an n-type; and
   a conductive back side contact coupled to said substantially conductive semiconductor region, said conductive back side contact being disposed on a second side of said die opposite said first side, wherein said common conductor, said substantially conductive semiconductor region, and said conductive back side contact form a common conducting bus for said resistor network from said common conductor to said conductive back side contact through said die.

19. The integrated circuit of claim 18 wherein resistors of said resistor network are disposed perpendicular to said common conductor in two rows on both sides of said common conductor.

20. The integrated circuit of claim 18 further comprising a resistive layer under said common conductor, portions of said resistive layer forming resistive regions of said resistors in said resistor network.

21. The integrated circuit of claim 20 further comprising an aluminum layer under said resistive layer, said aluminum layer being coupled to said substantially conductive semiconductor region to form a low ohmic contact thereto.

22. The integrated circuit of claim 21 wherein said substantially conductive semiconductor region is an arsenic-doped region.

23. The resistor network of claim 1 wherein said substantially conductive semiconductor region has a conductivity of below about 0.01 $\Omega$-cm.

24. The resistor network of claim 1 wherein said substantially conductive semiconductor region has a conductivity of below about 0.005 $\Omega$-cm.

25. The method of claim 11 wherein said substantially conductive semiconductor region has a conductivity of below about 0.01 $\Omega$-cm.

26. The method of claim 11 wherein said substantially conductive semiconductor region has a conductivity of below about 0.005 $\Omega$-cm.

27. The integrated circuit of claim 18 wherein said substantially conductive semiconductor region has a conductivity of below about 0.01 $\Omega$-cm.

28. The integrated circuit of claim 18 wherein said substantially conductive semiconductor region has a conductivity of below about 0.005 $\Omega$-cm.

* * * * *

UNITED STATES PATENT AND TRADEMARK OFFICE
CERTIFICATE OF CORRECTION

PATENT NO. : 5,652,460
DATED : July 29, 1997
INVENTOR(S) : Kalb, et al.

It is certified that error appears in the above-indentified patent and that said Letters Patent is hereby corrected as shown below:

Column 9, line 28, change "modem" to --modern--

Signed and Sealed this

Twenty-third Day of December, 1997

Attest:

BRUCE LEHMAN

Attesting Officer

Commissioner of Patents and Trademarks